United States Patent
Zhang

(10) Patent No.: US 11,600,799 B2
(45) Date of Patent: Mar. 7, 2023

(54) DISPLAY DEVICE

(71) Applicant: KunShan Go-Visionox Opto-Electronics Co., Ltd., Kunshan (CN)

(72) Inventor: Tan Zhang, Kunshan (CN)

(73) Assignee: KunShan Go-Visionox Opto-Electronics Co., Ltd., KunShan (CN)

( * ) Notice: Subject to any disclaimer, the term of this patent is extended or adjusted under 35 U.S.C. 154(b) by 109 days.

(21) Appl. No.: 16/582,193

(22) Filed: Sep. 25, 2019

(65) Prior Publication Data

US 2020/0020881 A1   Jan. 16, 2020

Related U.S. Application Data

(63) Continuation of application No. PCT/CN2018/091264, filed on Jun. 14, 2018.

(30) Foreign Application Priority Data

Oct. 31, 2017   (CN) .......................... 201711044437.5

(51) Int. Cl.
  *H10K 50/844*   (2023.01)
  *H01L 51/52*   (2006.01)
  *H01L 27/32*   (2006.01)

(52) U.S. Cl.
  CPC .......... *H01L 51/5253* (2013.01); *H01L 27/32* (2013.01); *H01L 27/3251* (2013.01); *H01L 51/5246* (2013.01)

(58) Field of Classification Search
  CPC ............. H01L 51/5253; H01L 51/5246; H01L 51/524; H01L 27/32; H01L 27/3251; H01L 23/498
  See application file for complete search history.

(56) References Cited

U.S. PATENT DOCUMENTS

| | | | | |
|---|---|---|---|---|
| 5,124,204 | A | * | 6/1992 | Yamashita ............. H05B 33/04 313/506 |
| 2005/0104516 | A1 | | 5/2005 | Park et al. |
| 2007/0120157 | A1 | | 5/2007 | Kim |
| 2008/0054785 | A1 | * | 3/2008 | Hayashi .................. B29C 65/14 156/273.3 |
| 2010/0277448 | A1 | * | 11/2010 | Okamoto ............ H01L 27/1225 345/206 |

(Continued)

FOREIGN PATENT DOCUMENTS

| | | |
|---|---|---|
| CN | 1454030 A | 11/2003 |
| CN | 201114861 Y * | 9/2008 |

(Continued)

OTHER PUBLICATIONS

PCT Written Opinion dated Sep. 17, 2018 in International Application No. PCT/CN2018/091264.

(Continued)

*Primary Examiner* — Tuan A Hoang
(74) *Attorney, Agent, or Firm* — Rimon PC

(57) ABSTRACT

A display device includes a substrate, an OLED module disposed on a first surface of the substrate, and a tracing region disposed on a second surface of the substrate. The second surface is opposite to the first surface, and the tracing region is electrically connected to the OLED module.

15 Claims, 6 Drawing Sheets

(56) References Cited

U.S. PATENT DOCUMENTS

| | | | | |
|---|---|---|---|---|
| 2011/0114954 | A1* | 5/2011 | Lee | H01L 51/5246 |
| | | | | 257/59 |
| 2012/0153333 | A1* | 6/2012 | Yamazaki | H01L 51/5253 |
| | | | | 257/E33.073 |
| 2014/0340609 | A1* | 11/2014 | Taylor | H05B 33/04 |
| | | | | 349/160 |
| 2015/0187807 | A1 | 7/2015 | Tsuruoka et al. | |
| 2015/0232621 | A1* | 8/2015 | Jeong | B32B 27/36 |
| | | | | 427/407.1 |
| 2016/0111678 | A1 | 4/2016 | Lee et al. | |
| 2017/0294496 | A1* | 10/2017 | Wang | H01L 27/3276 |
| 2019/0081272 | A1* | 3/2019 | Jung | H01L 51/5237 |

FOREIGN PATENT DOCUMENTS

| | | | | |
|---|---|---|---|---|
| CN | 202601095 | U | | 12/2012 |
| CN | 103346163 | A | | 10/2013 |
| CN | 104035253 | A | | 9/2014 |
| CN | 105431767 | A | * 3/2016 | ........... G02F 1/1333 |
| CN | 106030687 | A | | 10/2016 |
| CN | 106495468 | A | | 3/2017 |
| CN | 106847864 | A | | 6/2017 |
| CN | 107833978 | A | | 3/2018 |
| TW | 517356 | B | | 1/2003 |
| TW | 201328869 | A | | 7/2013 |
| WO | 2017/047134 | A | | 3/2017 |

OTHER PUBLICATIONS

Chinese First Office Action for CN Application No. 201711044437.5 dated Dec. 28, 2018.
Chinese Second Office Action for CN Application No. 201711044437.5 dated Aug. 2, 2019.
Chinese Third Office Action for CN Application No. 201711044437.5 dated Mar. 5, 2020.
Taiwan First Office Action for Application No. 107123666 dated Apr. 19, 2019.
Taiwan Second Office Action for Application No. 107123666 dated Aug. 30, 2019.
PCT International Search Report dated Sep. 17, 2018 in International Application No. PCT/CN2018/091264.
Taiwan Office Action for Application No. 107123666 dated Sep. 18, 2020.

* cited by examiner

DISPLAY DEVICE

CROSS-REFERENCE TO RELATED APPLICATIONS

This application is a continuation of International Application No. PCT/CN2018/091264 filed on Jun. 14, 2018, which claims priority to Chinese patent application No. 201711044437.5 filed on Oct. 31, 2017. Both applications are incorporated herein by reference in their entireties.

TECHNICAL FIELD

The present application relates to the field of display technologies, particularly to a display device.

BACKGROUND

Organic Light Emitting Diode (OLED) is considered as one of the display technologies with the brightest prospects of development because of its advantages such as all-solid state, ultrathinness, fast response, high luminous efficiency, high contrast ratio, low power consumption, and easy realization of flexible display and 3D display. OLED has been widely used in electronic products such as mobile phone screens, computer monitors and full color televisions.

With the development of OLED technology and the improvement of requirements for a display screen, a display device is developing in the direction of narrow frame, even full screen and foldability. However, since non-display regions such as circuit traces and bonding regions are disposed on a periphery of the display device normally, a full screen display of the display device in a flattened state is difficult to be realized. Currently, a full screen display effect is generally realized by bending the non-display regions to a back surface of the display device. However, when the non-display regions of the display device is bent, it is easy to damage circuits and other structures of the regions, which results in failure of functions of the display device. Therefore, there are still major difficulties to realize the full screen or narrow frame display of the display device.

SUMMARY

In view of this, embodiments of the present application provide a display device, which solves the problem that a display device is difficult to realize a full screen or a narrow frame display.

A display device provided by an embodiment of the present application includes a substrate, an OLED module disposed on a first surface of the substrate and a tracing region disposed on a second surface of the substrate opposite to the first surface. The tracing region is electrically connected to the OLED module.

In an embodiment, the substrate includes a via hole, and a circuit trace in the tracing region is connected to the OLED module via the via hole.

In an embodiment, the display device further includes a bonding region disposed on the second surface of the substrate, and a lead wire in the bonding region is connected to the OLED module via the via hole.

In an embodiment, the display device further includes a bonding region disposed on the first surface of the substrate.

In an embodiment, the bonding region is disposed at an edge of a short side of the first surface of the substrate, and the tracing region is disposed at edges of two long sides of the second surface of the substrate.

In an embodiment, the substrate is made of an ultra-thin glass.

In an embodiment, the substrate includes a first substrate layer and a second substrate layer that are integrally sealed, and at least one of the first substrate layer and the second substrate layer is made of an ultra-thin glass.

In an embodiment, the first substrate layer and the second substrate layer are integrally sealed by at least one of an OCA, a barrier OCA, an UV glue, a silicone rubber and a glass glue.

In an embodiment, the display device further includes a first protection layer covering the OLED module and being integrally sealed with the substrate.

In an embodiment, the display device further includes a second protection layer covering the tracing region and being integrally sealed with the substrate.

In an embodiment, materials of the first protection layer and the second protection layer are ultra-thin glass, and the first protection layer and the second protection layer are sealed with the substrate by at least one of an OCA, a barrier OCA, an UV glue, a silicone rubber and a glass glue, respectively.

In an embodiment, the display device further includes a first protection layer, a second protection layer and an encapsulation layer disposed between the first protection layer and the second protection layer. A middle portion of the encapsulation layer includes an empty groove region. The substrate and the OLED module are disposed in the empty groove region.

In an embodiment, the OLED module includes a plurality of functional layers, a strain barrier layer is disposed between adjacent ones of the plurality of the functional layers, and the strain barrier layer includes a chamber and an elastic material layer surrounding an outer periphery of the chamber.

In an embodiment, the empty groove region and/or the chamber is filled with gas or liquid, and the encapsulation layer and/or the elastic material layer is composed of a material having low elastic modulus.

In an embodiment, a size of a bottom area of the empty groove region is larger than that of the substrate.

In an embodiment, a first silicone oil layer is disposed between the OLED module and the first protection layer, and/or a second silicone oil layer is disposed between the substrate and the second protection layer.

In an embodiment, the encapsulation layer includes at least one air guiding groove and a sealing material for sealing the at least one air guiding groove.

In an embodiment, the display device further includes a first protection layer and a second protection layer, the second protection layer is provided with a concave groove, the substrate and the OLED module are disposed in the concave groove, and the first protection layer is disposed on the OLED module.

In an embodiment, the first protection layer is located in the concave groove of the second protection layer, and an upper surface of the first protection layer is flat with an upper surface of the second protection layer.

In an embodiment, a cross-sectional area of the concave groove is larger than that of the substrate.

In an embodiment, a periphery of the first protection layer and sides of the concave groove of the second protection layer are encapsulated by a laser sintered glass powder process.

In a display device provided by the embodiments, a tracing region of a non-display portion is disposed on a back surface of a substrate, so that when the tracing region is electrically connected to an OLED module located at a front surface of the display device to complete a tracing function, a area of a non-display region located at a front surface of the display device is greatly reduced, which make the device realize a narrow frame display and even a full screen display, thereby enhancing a display effect of a screen and improving visual experience of a user.

DETAILED DESCRIPTION

In order to make purposes, technical means and advantages of the present application more clear and understandable, the present application will be further described in detail as follows with reference to the accompanying drawings.

Figure 1:
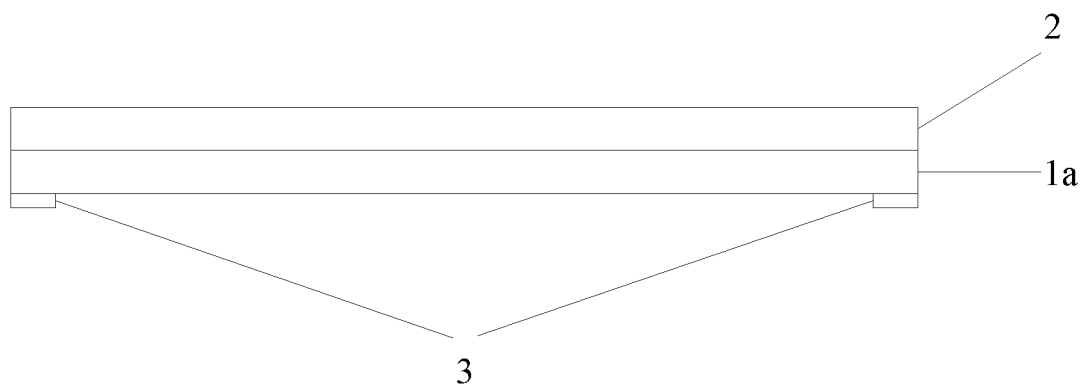
FIG. 1 is a schematic structural diagram illustrating a display device according to an embodiment of the present application.

FIG. 1 is a schematic structural diagram illustrating a display device according to an embodiment of the present application. As shown in FIG. 1, the display device includes a substrate 1a, an OLED module 2 disposed on a first surface of the substrate 1a, and a tracing region 3 disposed on a second surface of the substrate 1a. The second surface is a surface opposite to the first surface, and the tracing region 3 is electrically connected to the OLED module 2 of the first surface.

In the embodiment, the first surface of the substrate 1a is a front surface on which a TFT array layer, an anode layer, an organic light-emitting layer, a cathode layer and the like may be sequentially disposed, and these functional layers collectively constitute the OLED module 2 to become a display region of the display device. The second surface of the substrate 1a is a back surface. The tracing region 3 as a non-display portion is disposed at a corresponding position of the back surface of the substrate 1a, such as an peripheral edge region, which greatly reduce the area of a non-display region on the front surface of the device, so that the device may realize the display effect of narrow frame and even full screen.

In a display device provided by the embodiment, a tracing region of a non-display portion is disposed on a back surface of a substrate, so that when the tracing region is electrically connected to an OLED module located at a front surface of the display device to complete a tracing function, a area of a non-display region located at a front surface of the display device is greatly reduced, which make the device realize a narrow frame display and even a full screen display, thereby enhancing a display effect of a screen and improving visual experience of a user.

In an embodiment of the present application, the substrate 1a includes a via hole, and a circuit trace in the tracing region 3 is connected to the OLED module 2 located at the front surface via the via hole on the substrate 1a. Specifically, the via hole structure may be disposed one-to-one corresponding to the circuit trace, or one via hole is disposed correspond to a plurality of circuit traces, or one via hole is disposed correspond to all circuit traces. For the formation of the via hole, the via hole may be punched by a laser or may be realized by a chemical method, and various conductive media such as copper may be evaporated on walls of the hole. Thus, the circuit trace in the tracing region 3 on the back surface of the substrate 1a can be electrically connected to the OLED module 2 of the front surface via the via hole. Of course, the tracing region 3 on the back surface and the first surface of the substrate 1a may be electrically connected in other ways, which is not limited by the present application.

For the substrate, it may be either a hard glass substrate, or may be a bendable ultra-thin glass, or may be a flexible substrate made of a material such as Polyimide (PI), Polyethylene Terephthalate (PET) or Polyethylene Naphthalene (PEN) and the like.

In a preferred embodiment of the present application, the substrate 1a is one layer and is an ultra-thin glass. An organic light-emitting structure such as a TFT array layer, an anode layer, an organic light-emitting layer and a cathode layer may be prepared on the front surface of the ultra-thin glass to form the display region of the display device. A circuit trace is prepared on the back surface thereof to form the tracing region of the display device, and a via hole via the front surface and the back surface is prepared on the ultra-thin glass, so that the circuit trace on the back surface is electrically connected to the display region on the front surface via the via hole. The order of the above three processes is not fixed, and those skilled in the art can perform corresponding adjustments according to actual process requirements.

Compared with a common glass substrate, the ultra-thin glass not only has a smaller thickness, such as, 0.1 mm to 0.5 mm, but also has good flexibility, and can be used as a bendable flexible substrate to meet foldable requirements of the display device. In addition, the ultra-thin glass also has good stiffness, the stiffness of one layer of ultra-thin glass may be equivalent to that of superposed several film layers of PI/PET, etc., and the precision of punching holes in the ultra-thin glass is higher. Therefore, the display device provided by the embodiment, by adopting the ultra-thin glass replace traditional substrates such as PI, PET or PEN, not only satisfies the requirement of folding and improves production precision, but also avoids contradiction between the stiffness caused by utilizing a material such as PI, PET or PEN and the easy splitting of film layers after folding. Thus, the user's requirements for stiffness are satisfied, and at the same time the qualities of the display device is ensured.

Figure 2:
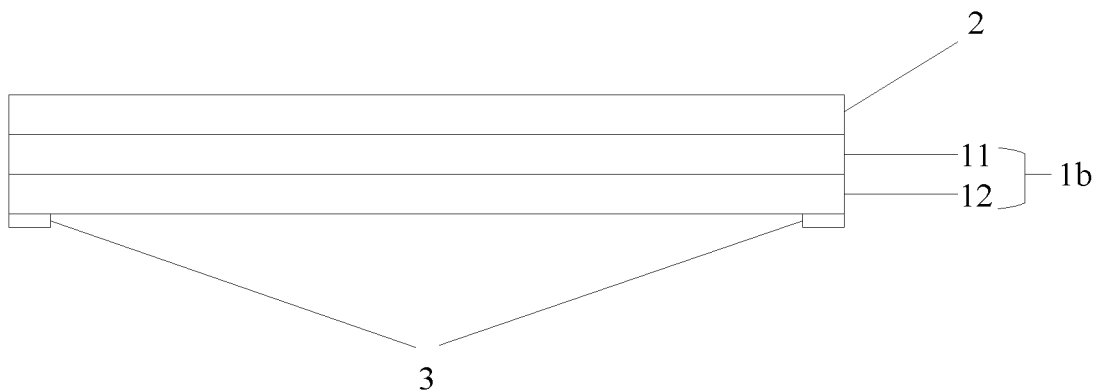
FIG. 2 is a schematic structural diagram illustrating a display device according to another embodiment of the present application.

In another embodiment of the present application, as shown in FIG. 2, a substrate 1b includes a first substrate layer 11 and a second substrate layer 12 that are integrally sealed, and at least one of the first substrate layer 11 and the second substrate layer 12 is made of an ultra-thin glass. That is, both the first substrate layer 11 and the second substrate layer 12 may be made of the ultra-thin glass, or one of the first substrate layer 11 and the second substrate layer 12 may be made of the ultra-thin glass. An OLED module 2 is disposed on a surface of the first substrate layer 11 away from the second substrate layer 12 (namely, a front surface of the substrate 1b), and a tracing region 3 is disposed on a surface of the second substrate layer 12 away from the first substrate layer 11 (namely, a back surface of the substrate 1b). Corresponding positions of the first substrate layer 11 and the second substrate layer 12 are both provided with via hole structures, and the tracing region 3 disposed on the second substrate layer 12 may be electrically connected to the OLED module 2 on a substrate layer 11 through via holes of two substrate layers.

At least one of an Optical Clear Adhesive (OCA), an OCA with a barrier function, a silicone rubber, an Ultraviolet Rays (UV) glue or other adhesives may be adopted to seal the first substrate layer 11 and the second substrate layer 12. When both the first substrate layer 11 and the second substrate layer 12 are the ultra-thin glass, a Frit (a glass glue) manner may also be selected to seal two layers of ultra-thin glass. Because the glass glue contains a silicon material homogenous to the material of the ultra-thin glass, two layers of ultra-thin glass may be better sealed, so that the substrate 1b after sealing as a whole has a better water blocking performance.

The distribution manner of adhesives may be various, for example, a block shape, a strip shape or other regular or irregular closed patterns, or a ring shape distributed around the substrate, which is not limited by the present application, as long as the two substrate layers may be firmly integrally sealed.

In addition, since surfaces close to each other between the first substrate layer 11 and the second substrate layer 12 are not provided with components, the two may be integrally sealed by adopting a full-area sealing manner, and this sealing manner may further improve reliability of the device.

A display device provided by the embodiment further enhances the stiffness of the display device by configuring a substrate as two-layer substrate layers sealed integrally, wherein at least one layer is a structure of an ultra-thin glass. Moreover, an OLED module and a tracing region are respectively disposed on two surfaces facing away from each other of different substrate layers, so that the influence on each other or the structure of the substrate caused by the OLED module and the tracing region being disposed on a front surface and a back surface of the same substrate is avoided, and the difficulty of the process is reduced.

In order to transmit a driving signal and a driving power to the OLED module, flexible thin film circuit boards such as a Chip on Film (COF) and a Flexible Printed Circuit (FPC), and a driver IC are required to be bound, and these flexible thin film circuit boards and the driver IC constitute a bonding region of the display device.

Figure 3:
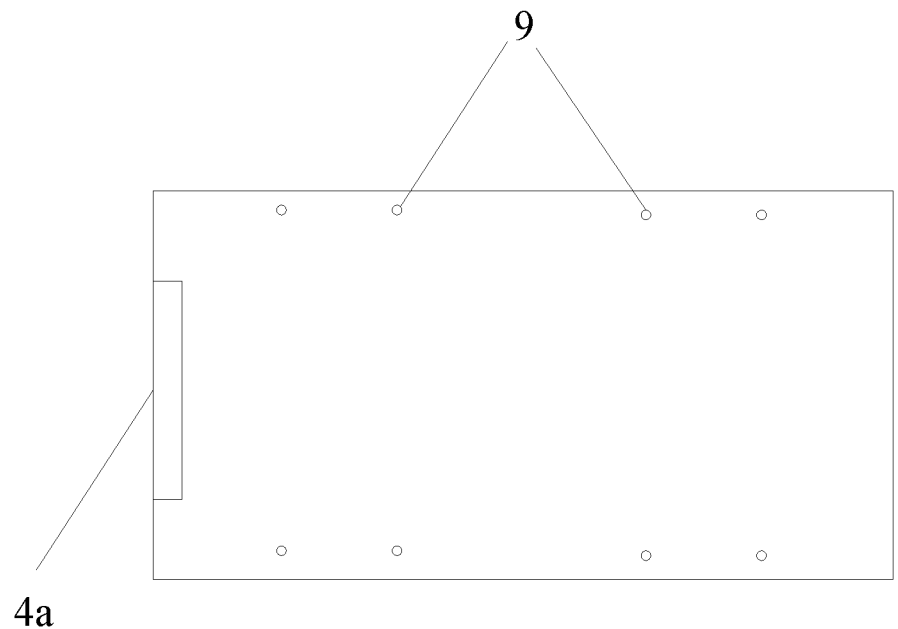
FIG. 3(a) is a front schematic structural diagram illustrating a substrate of a display device according to an embodiment of the present application.
FIG. 3(b) is a back schematic structural diagram illustrating a substrate of a display device according to an embodiment of the present application.
Figure 3:
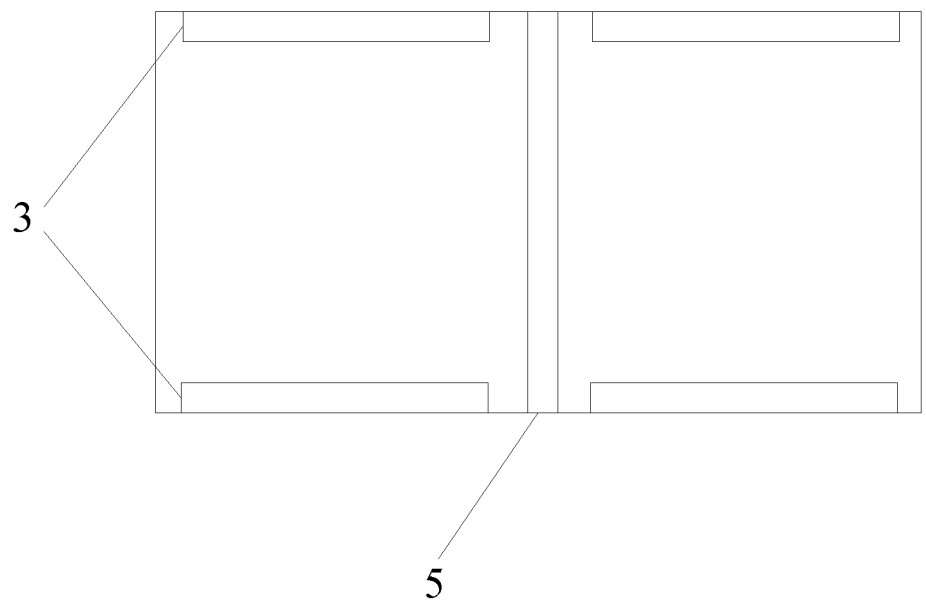

In an embodiment of the present application, as shown in FIG. 3(a) and FIG. 3(b), a tracing region 3 is disposed on a back surface of a substrate, a bonding region 4a is disposed on a front surface (namely, a first surface) of the substrate, and may be disposed at the position where a camera or an earpiece of the display device is located. In the embodiment, a bending region 5 is disposed in an intermediate position of two relatively short sides and is perpendicular to two relatively long sides of the substrate, the bonding region 4a is disposed at an edge of one short side of the front surface of the substrate, and the tracing region 3 is disposed at edges of two long sides of the back surface of the substrate. A circuit trace in the tracing region 3 is electrically connected to the front surface of the substrate via a via hole 9. Since the via hole 9 in the embodiment is covered by the tracing region 3 of the back surface, the via hole 9 is not shown in FIG. 3(b).

Although eight via holes 9 are marked in corresponding positions of the tracing region 3 in FIG. 3(a), the specific number and positions of the via holes 9 may be set differently according to different situations in the actual design and application. The bending region may also be disposed at other positions according to actual needs, for example, the bending region is disposed at an intermediate position of the two relatively long sides and is perpendicular to the two relatively short sides of the substrate or disposed along a diagonal direction of the substrate. The positions of the tracing region 3 and the bonding region 4a may also be adjusted accordingly, which is not limited specifically by the present application.

When the substrate is one layer of ultra-thin glass or a first substrate layer thereof is an ultra-thin glass, an Anisotropic Conductive Film (ACF) is used to bond the substrate, a flexible film circuit board and a driver IC together through the bonding process of a Film on Glass (FOG) and a Chip on Glass (COG). When the first substrate layer of the substrate is a PI substrate layer, the substrate, the flexible thin film circuit board and the driver IC may be bonded together through the bonding process of a Film on PI (FOP) and a Chip on PI (COP). These two bonding manners both can enable the display device realize the display effect of narrow frame.

Figure 4:
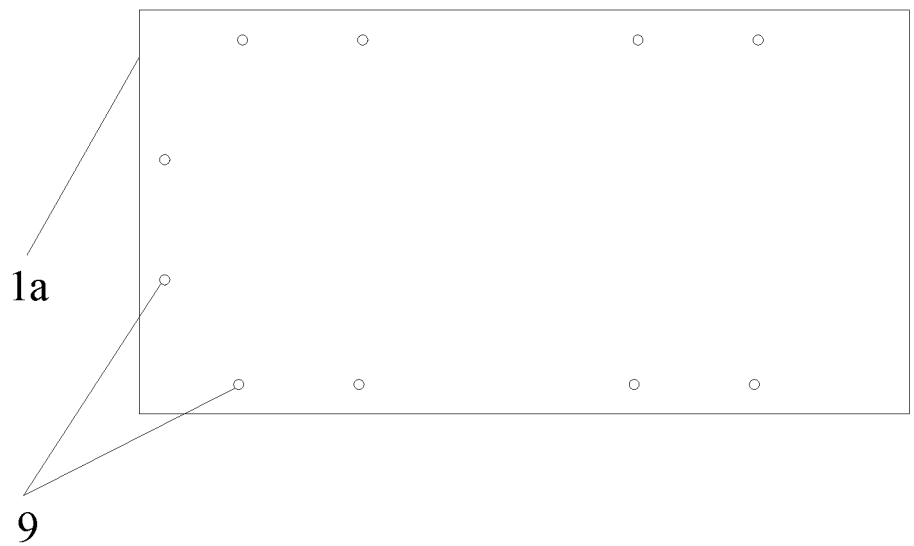
FIG. 4(a) is a front schematic structural diagram illustrating a substrate of a display device according to another embodiment of the present application.
FIG. 4(b) is a back schematic structural diagram illustrating a substrate of a display device according to another embodiment of the present application.
Figure 4:
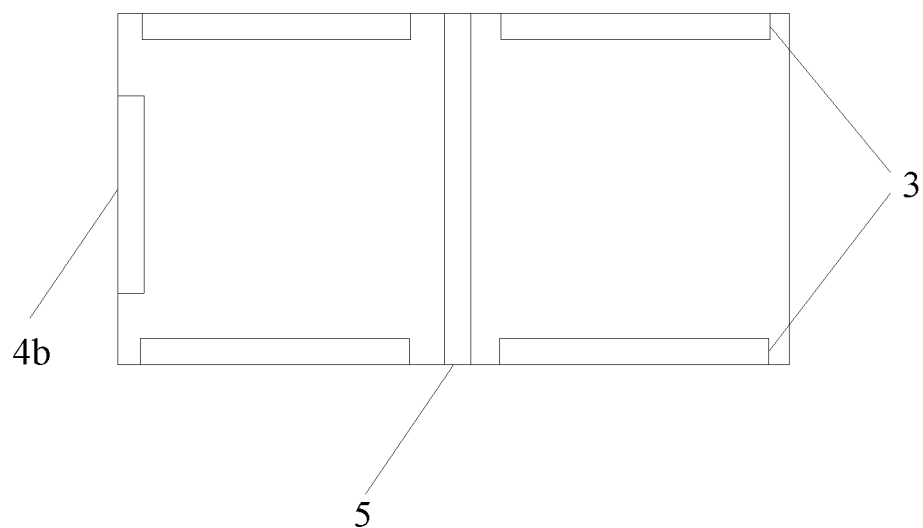

In another embodiment of the present application, as shown in FIG. 4(a) and FIG. 4(b), a bonding region 4b and a tracing region 3 are both disposed on a back surface (namely, a second surface) of a substrate, and at the same time, a lead wire in the bonding region 4b may also be connected to an OLED module 2 via a via hole 9 on the substrate, thus the conduction with a front surface is performed, and the display effect of full screen is achieved.

In the embodiment, a position corresponding to the bonding region 4b on the substrate 1a is provided with two via holes 9 for the passage the lead wire. In fact, the lead wire of the bonding region 4b may also share via holes 9 with the circuit trace in the tracing region 3. The number and position of the via holes 9 in the embodiment are also merely an example of the present application, and are not intended to limit the present application.

An ultra-thin glass is adopted as a flexible substrate in a display device provided by the embodiment, which realizes bendable performance of the device and also plays a good supporting role, thereby improving the overall stiffness of the device. In addition, in the embodiment, the bonding region is moved from the front surface to the back surface of the display device, which further reduces the area of a non-display region on the front surface of the device and realizes the full screen display.

Figure 5:
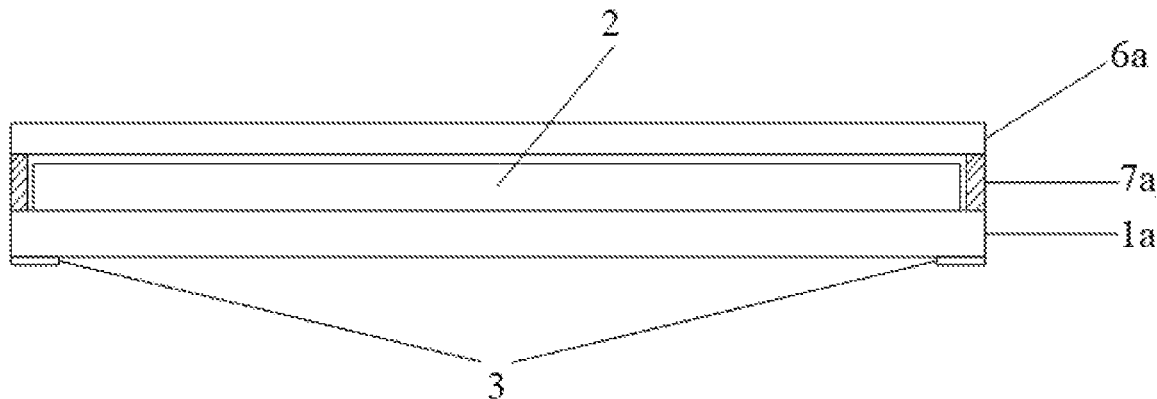
FIG. 5 is a schematic structural diagram illustrating a display device according to another embodiment of the present application.
Figure 6:
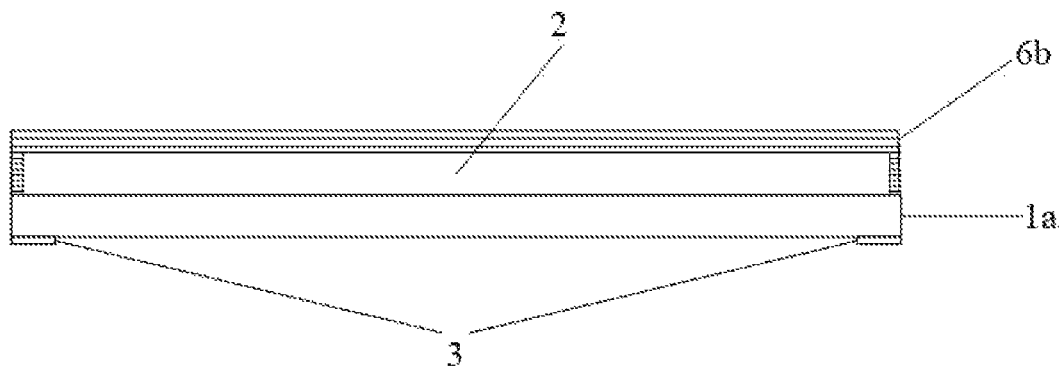
FIG. 6 is a schematic structural diagram illustrating a display device according to another embodiment of the present application.

In an embodiment of the present application, as shown in FIG. 5 and FIG. 6, the flexible display device further includes a first protection layer covering the OLED module 2 and being integrally sealed with the substrate 1a, and the first protection layer is used for protecting the display region of the substrate 1a. Of course, when the bonding region is disposed on the front surface of the substrate 1a, the first protection layer is also configured to protect the flexible film circuit board and the driver IC of the bonding region. The material of the first protection layer may be an ultra-thin glass, for example, the first protection layer 6a in the embodiment shown in FIG. 5 is the ultra-thin glass.

When the first protection layer is the ultra-thin glass, the first protection layer and the substrate 1a may be sealed by ways such as peripheral encapsulation, block encapsulation or full-surface encapsulation. For example, the embodiment shown in FIG. 5 is sealed in the way of peripheral encapsulation, and an encapsulation layer 7a may specifically be at least one of an OCA, a barrier OCA, a silicone rubber, a glass glue, an UV glue and the like. In the embodiment, the first protection layer 6a is disposed on the front surface of the OLED module 2, the encapsulation layer 7a is disposed around the OLED module 2, and the first protection layer 6a is sealed with the encapsulation layer 7a. Thus the substrate 1a may be tightly sealed with the encapsulation layer 7a by only a narrow frame reserved on the substrate 1a, and then integrally sealed with the first protection layer 6a. The reserved frame only needs to meet the basic requirement of sealing, and has little effect on the full screen display of the device. Moreover, the overall stiffness of the device is further improved by adopting the ultra-thin glass as the protection layer in the embodiment.

Of course, the first protection layer may also be a thin film encapsulating material. As shown in FIG. 6, a thin film layer may be attached to both a periphery and the front surface of the OLED module 2 to form a first protection layer 6b. Specifically, the thin film encapsulation layer may be a transparent thin film layer formed by alternately stacking an organic thin film and an inorganic thin film, which has good water and oxygen barrier properties. Since the transparent film layer is light and thin, its thickness generally does not exceed 3 μm, and thus the good sealing effect can be realized without affecting the optical display by adopting a film to perform the full-surface encapsulation.

Figure 7:
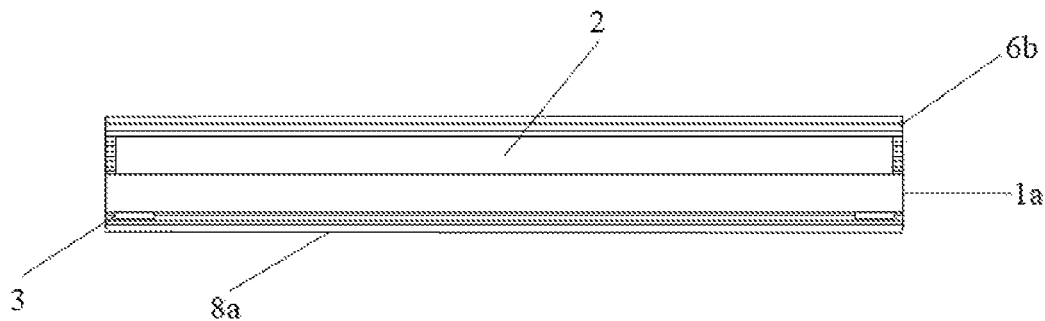
FIG. 7 is a schematic structural diagram illustrating a display device according to another embodiment of the present application.

In another embodiment of the present application, as shown in FIG. 7, the display device further includes a second protection layer 8a covering the tracing region 3 and being integrally sealed with the substrate 1a. The second protection layer 8a is used for protecting the circuit trace, and when the bonding region is also located on the back surface of the substrate 1a, the second protection layer 8a is also configured to protect the flexible film circuit board and the driver IC of the bonding region. In the embodiment, the material of the second protection layer 8a is a film encapsulating material, and in other embodiments, the material of the second protection layer 8a may also be an ultra-thin glass. The second protection layer 8a and the substrate 1a may also be sealed by adopting colloids such as an OCA, a barrier OCA, a silicone rubber, a glass glue or an UV glue.

In a display device provided by the embodiment, a circuit trace and/or a flexible thin film circuit board, a driver IC and other components on a back surface of a substrate are protected accordingly by adding another protection layer on the back surface of the substrate, and the reliability of the device as a whole is further increased.

Figure 8:
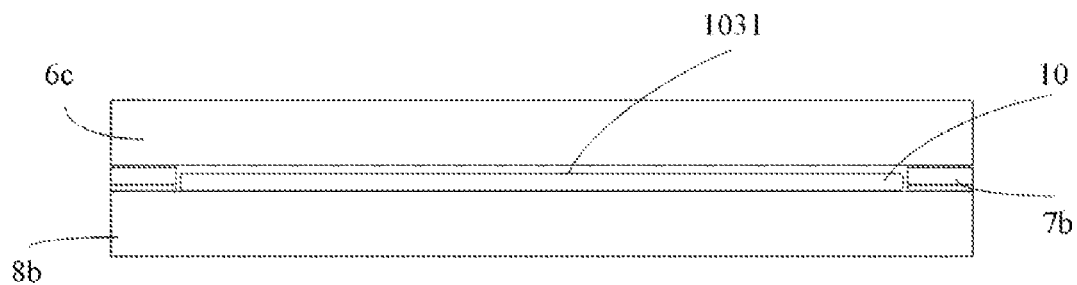
FIG. 8 is a schematic structural diagram illustrating a display device according to another embodiment of the present application.

In an embodiment of the present application, a first protection layer and a second protection layer are both made of ultra-thin glass. As shown in FIG. 8, a display device includes a first protection layer 6a, a second protection layer 8b, an encapsulation layer 7b disposed between the first protection layer 6a and the second protection layer 8b, and a display panel 10 (includes a substrate and an OLED module). A middle portion of the encapsulation layer 7b includes an empty groove region 1031, the display panel 10 is disposed in the empty groove region 1031 of the encapsulation layer 7b, and a size of a bottom area of the empty groove region 1031 is larger than a size of the display panel 10.

It can be seen that an ultra-thin glass is adopted to replace the upper and lower cover plates of the existing flexible display device in the embodiment of the present application. Since the ultra-thin glass itself has excellent stiffness and bending resistance, the problem of a demand contradiction between the stiffness and the prevention of film splitting in the existing display device may be solved effectively. Meanwhile, since a display panel 10 is disposed in an empty groove region 1031 between a first protection layer 6c and a second protection layer 8b, and a size of a bottom area of the empty groove region 1031 is larger than a size of the display panel 10 (namely, a size of a substrate), Therefore, when the flexible display panel 10 is bent, the display panel 10 may be slid in the empty groove region 1031 relative to the first protection layer 6c and the second protection layer 8b, thereby alleviating the bending stress, and delamination of film layers inside the display panel 10 may be avoided effectively. The bending resistance of a display device is further improved, and the reliability of a product is improved.

In an embodiment of the present application, in order to make the sliding of the display panel 10 in the empty groove region 1031 during a bending process more flexible and smooth, a first silicone oil layer may be disposed between the display panel 10 and the first protection layer 6c (namely, between the OLED module and the first protection layer 6c), and/or a second silicone oil layer is disposed between the display panel 10 and the second protection layer 8b (namely, between the substrate and the second protection layer 8b). However, it should be understood that the display panel 10 can be slid in the empty groove region 1031 even without the first silicone oil layer and the second silicone oil layer, and whether the display device includes the first silicone oil layer and the second silicone oil layer is not limited by the present application.

In an embodiment, the encapsulation layer 7b of the display device includes at least one air guiding groove and a sealing material for sealing the air guiding groove. Air bubbles generated by a bonding process can be guided away by these air guiding grooves during a process of bonding the first protection layer 6c, thereby preventing these air bubbles from remaining between the first protection layer 6c and the display panel 10. After the bonding process of the first protection layer 6c is completed, the at least one air guiding groove is sealed with the sealing material.

Figure 9:
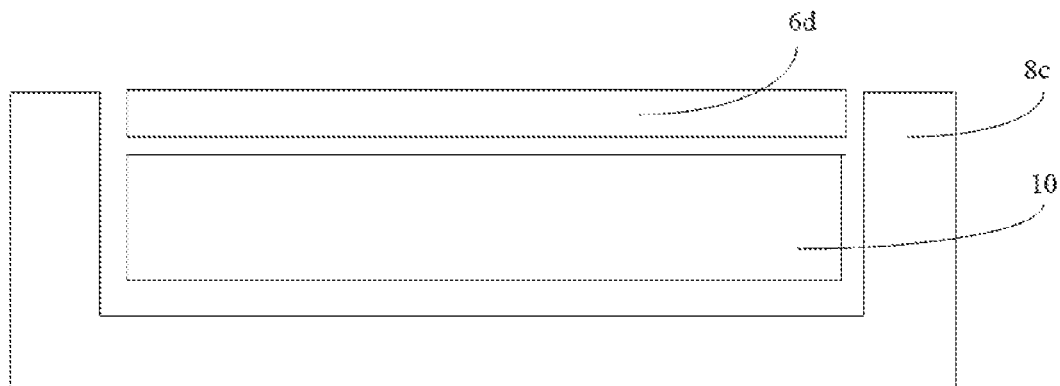
FIG. 9 is a schematic structural diagram illustrating a display device according to another embodiment of the present application.

In another embodiment of the present application, both a first protection layer and a second protection layer are also made of ultra-thin glass, and a structure of a display device is shown in FIG. 9. A second protection layer 8c is provided with a concave groove, a display panel 10 is disposed in the concave groove, and a first protection layer 6d is disposed on the display panel 10.

The second protection layer 8c with the concave groove in the middle thereof may be prepared by etching or the like in the middle of one ultra-thin glass, which may be prepared by ourselves or may be directly purchased by a glass sales company, and the concave groove thereof may be prepared by a craft method such as etching. The source or preparation manner of the second protection layer 8c with the concave groove in the middle thereof is not limited by present application.

The display panel 10 may be disposed in the concave groove of the second protection layer 8c by a bonding manner of an optical glue. Due to the existence of the concave groove, the sliding range of the first protection layer 6d is effectively limited, and the failure of the entire display device caused by the excessive displacement of the first protection layer 6d during a bending process is prevented.

The first protection layer 6d may be bonded on the display panel 10 by the optical glue, and after the bonding is completed, an upper surface of the first protection layer 6d should be kept at the same level as an upper surface of the second protection layer 8c. In an embodiment of the present application, a cross-sectional area of the concave groove of the second protection layer 8c with the concave groove in the middle thereof is larger than a cross-sectional area of the display panel 10, so that the display panel 10 can be slid in the concave groove during a bending process, thereby bending stress may be further dispersed, and the fracture failure of the display panel 10 is avoided. And the first protection layer 6d should be located in the concave groove of the second protection layer 8c. Due to the existence of the second protection layer 8c, the slip of the first protection layer 6d is effectively suppressed, and the bending resistance of the display device is improved.

It should be understood that the manner of disposing the display panel 10 in the concave groove of the second protection layer 8b may be optical glue bonding or silicone oil bonding, etc. When adopting the silicone oil bonding, the display panel 10 may be better slid in the concave groove to relieve the bending stress, but the specific disposing manner and the bonding material used are not limited by the present application.

Figure 10:
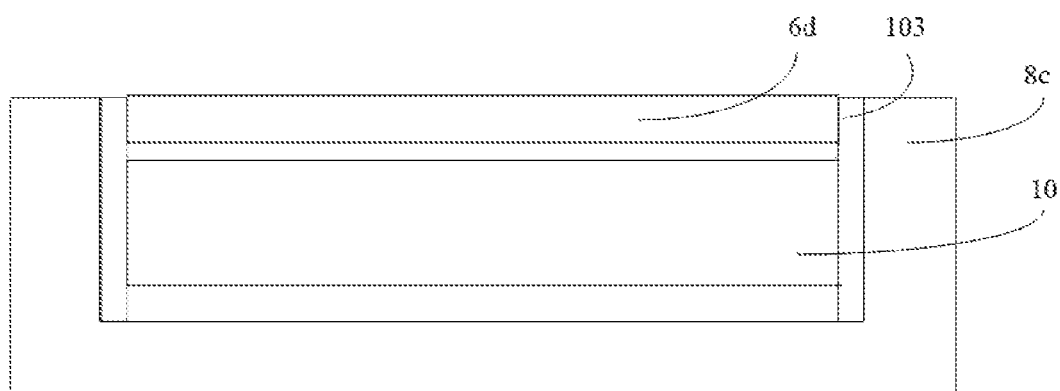
FIG. 10 is a schematic structural diagram illustrating a display device according to another embodiment of the present application.

In an embodiment of the present application, a periphery of the first protection layer 6d and sides of the concave groove of the second protection layer 8c are encapsulated by a laser sintered glass powder process. A glass powder layer 103 after encapsulating is shown in FIG. 10. A gap between the periphery of the first protection layer 6d and the sides of the concave groove of the second protection layer 8c is filled with the laser-sintered glass powder layer 103, thereby avoiding external moisture and oxygen entering the display panel 10. An upper surface of the display panel 10 after completing an internal encapsulation is covered with the first protection layer 6d, a lower surface and sides of the display panel 10 are covered with the second protection layer 8c, and a periphery of the display panel 10 is protected by the glass powder layer 103. Thus the entry of moisture and oxygen is blocked effectively, and the moisture and oxygen barrier performance of the display device is improved.

In addition, in order to reduce the stress between various material layers of the display device and prevent the occurrence of a phenomenon of fracture delamination. In an embodiment of the present application, a strain barrier layer is added between adjacent two material layers.

Figure 11:
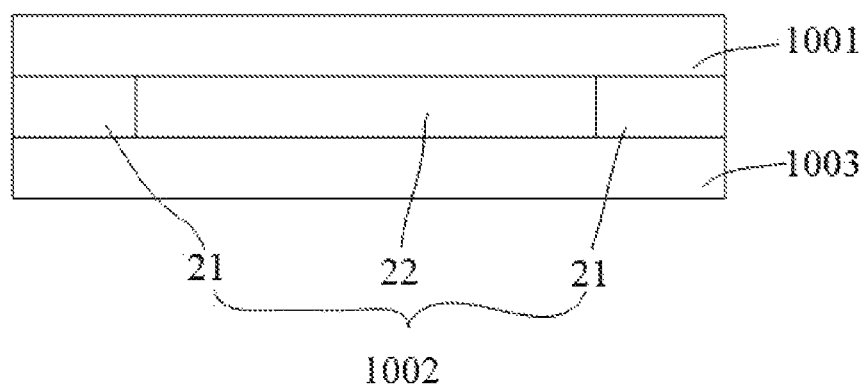
FIG. 11 is a schematic structural diagram illustrating a display device according to another embodiment of the present application.

FIG. 11 is a schematic structural diagram illustrating a display device according to an embodiment of the present application. As shown in FIG. 11, the display device provided by the embodiment of the present application includes a first module material layer 1001 and a second module material layer 1003 that are superposed, and at least one strain barrier layer 1002 disposed between the first module material layer 1001 and the second module material layer 1003. The strain barrier layer 1002 includes a chamber 22 and an elastic material layer 21 surrounding an outer periphery of the chamber.

It should be understood that a module material layer is a functional unit constituting a display device, and each functional unit may be composed of a plurality of functional layers. The module material layer may be a first protection layer, a second protection layer, or a functional layer in an OLED module (such as a TFT array layer, a touch screen, a polarizer and the like). In order to distinguish different module material layers, the qualifiers first, second and the like are introduced in the embodiments of the present application, such as the first module material layer 1001 and the second module material layer 1003 and the like. For example, when the first module material layer 1001 and the second module material layer 1003 are the first protection layer and the second protection layer, respectively, the strain barrier layer 1002 between the first module material layer 1001 and the second module material layer 1003 is the encapsulation layer 7b in the embodiment shown in FIG. 8. The chamber 22 is corresponding to the empty groove region 1031 in the encapsulation layer 7b, the display panel 10 is disposed therein, and the elastic material layer 21 surrounding an outer periphery of the chamber 22 is corresponding to an encapsulating material around the empty groove region 1031.

In an embodiment, the chamber 22 may be filled with gas, liquid (such as silicone oil) or may be in a vacuum state, all of which may play a role of isolating strain. However, when the chamber 22 is filled with the gas, the air pressure inside and outside the chamber 22 may be balanced.

In an embodiment, the elastic material layer 21 may be composed of a material having low elastic modulus, and the elastic modulus thereof may be from several KPa to several tens of KPa, which is far lower than that of the first module material layer 1001 and the second module material layer 1003 (for example, the elastic modulus of the module material layer in the display device is from several tens of GPa to hundreds of GPa). Thus the deformation ability of the elastic material layer 21 during a deformation process, particularly when the elastic material layer 21 is subjected to a shear stress, may be utilized to provide an effective passage for the slip between the first module material layer 1001 and the second module material layer 1003.

In an embodiment, a material of the elastic material layer 21 may be a silicone rubber. However, the present application is not limited thereto, and the material of the elastic material layer 21 may also be other materials having low elastic modulus.

A strain barrier layer 1002 is disposed between a first module material layer 1001 and a second module material layer 1003 in a display device provided by the embodiments of the present application. Since the strain barrier layer 1002 can effectively block the strain of the first module material layer 1001 and the second module material layer 1003, the transmission of strain between the first module material layer 1001 and the second module material layer 1003 can be effectively prevented when a bending deformation is occurred, and the strain of the first module material layer 1001 and the second module material layer 1003 is reduced. Thus the bending resistance of the display device is significantly improved and the reliability of a product is improved.

However, it should be understood that a flexible display module provided by the embodiments of the present application is not limited to including only the first module material layer 1001 and the second module material layer 1003 shown in FIG. 11, and may also include more layers of module material layers. In addition, the strain barrier layer 1002 may be disposed between adjacent two layers of the module material layers. The number of layers of the module material layers, and which of adjacent module material layers are provided with the strain barrier layer 1002, are not specifically limited by the embodiments of the present application.

In an embodiment of the present application, when a final display product to be prepared is required to have a shape of a preset curved surface (for example, a 2.5D curved surface with a flat surface in the middle and a curved surface in the periphery, or a 3D curved surface with a curved surface in the middle and the periphery), a frame with the shape of the preset curved surface may be prepared first, and then a bendable display device provided by the embodiments of the present application is installed into the frame. The perimeter of the frame may be less than the perimeter of the display device. Since a device itself has a bendable property when it is a flexible display device, and when the whole is installed in a frame with a smaller perimeter than the whole, the whole is curved from a plane surface into a curved surface.

In an embodiment, installing the flexible display device into the frame may include: attaching the frame to a periphery of the entire flexible device in a frame-bonding manner. In order to ensure the installation of the flexible AMOLED panel and the ultra-thin glass more secure, an annular groove may be provided on an inner surface of the frame.

The depth of the annular groove is preferably 3-5 mm, so that the secure of the installation is be ensured without making the frame too thick. The width of the annular groove may be equal to the thickness of the flexible display device.

A sectional shape of the annular groove may be any one of a U shape, an arc shape and a trapezoid shape.

The above are only the preferred embodiments of the present application, which are not intended to limit the protection scope of the present application. Any modifications, equivalent substitutions, improvements and the like made within the spirit and principle of the present application should be included within the protection scope of the present application.

What is claimed is:

1. A display device, comprising:
a substrate;
an OLED module disposed on a first surface of the substrate; and
a tracing region disposed on a second surface of the substrate opposite to the first surface, the tracing region being electrically connected to the OLED module, wherein the tracing region is disposed at a peripheral edge region of the second surface of the substrate, and a projection of the tracing region on the second surface of the substrate is only at an edge position of a projection of the OLED module on the second surface of the substrate,
wherein the substrate comprises a via hole disposed in the peripheral edge region of the second surface of the substrate, and a circuit trace in the tracing region is connected to the OLED module via the via hole;
wherein the display device further comprises a bending region disposed in an intermediate position of two short sides of the substrate and perpendicular to two long sides of the substrate, and the tracing region comprises a first sub-tracing region and a second sub-tracing region disposed at an edge of one long side of the second surface of the substrate and disposed at two sides of the bending region, a third sub-tracing region and a fourth sub-tracing region disposed at an edge of another long side of the second surface of the substrate and disposed at the two sides of the bending region,
wherein the substrate comprises a first substrate layer and a second substrate layer that are integrally sealed, and at least one of the first substrate layer and the second substrate layer is made of an ultra-thin glass,
wherein the OLED module comprises a TFT array layer, the first surface of the substrate is a surface of the first substrate layer away from the second substrate layer, and the second surface of the substrate is a surface of the second substrate layer away from the first substrate layer, and
wherein the display device further comprises a bonding region connected to the OLED module and disposed on the first surface of the substrate, the bonding region comprises a flexible thin film circuit board and a driver IC, and the bonding region is disposed at an edge of the short side of the first surface of the substrate.

2. The display device according to claim 1, wherein the first substrate layer and the second substrate layer are integrally sealed by at least one of an OCA, a barrier OCA, an UV glue, a silicone rubber and a glass glue.

3. The display device according to claim 1, further comprising: a first protection layer covering the OLED module and being integrally sealed with the substrate.

4. The display device according to claim 3, further comprising: a second protection layer covering the tracing region and being integrally sealed with the substrate.

5. The display device according to claim 4, wherein a material of one or both of the first protection layer and the second protection layer is an ultra-thin glass, and the first protection layer and the second protection layer are sealed with the substrate by at least one of an OCA, a barrier OCA, an UV glue, a silicone rubber and a glass glue, respectively.

6. The display device according to claim 1, further comprising: a first protection layer, a second protection layer and an encapsulation layer disposed between the first protection layer and the second protection layer, wherein a middle portion of the encapsulation layer comprises an empty groove region, and the substrate and the OLED module are disposed in the empty groove region, a size of a bottom area of the empty groove region is larger than a size of the substrate and the OLED module to allow the substrate and the OLED module slid in the empty groove region, for alleviating a bending stress when the substrate and the OLED module are bent.

7. The display device according to claim 6, wherein the empty groove region is filled with gas or liquid, and the encapsulation layer is composed of a material having low elastic modulus.

8. The display device according to claim 6, wherein a size of a bottom area of the empty groove region is larger than that of the substrate.

9. The display device according to claim 6, wherein a first silicone oil layer is disposed between the OLED module and the first protection layer, and, a second silicone oil layer is disposed between the substrate and the second protection layer.

10. The display device according to claim 6, wherein the encapsulation layer comprises at least one air guiding groove and a sealing material for sealing the at least one air guiding groove.

11. The display device according to claim 1, further comprising: a first protection layer and a second protection layer, wherein the second protection layer is provided with a concave groove, the substrate and the OLED module are disposed in the concave groove, and the first protection layer is disposed on the OLED module.

12. The display device according to claim 11, wherein the first protection layer is located in the concave groove of the second protection layer, and an upper surface of the first protection layer is flat with an upper surface of the second protection layer.

13. The display device according to claim 12, wherein a cross-sectional area of the concave groove is larger than that of the substrate.

14. The display device according to claim 13, wherein a periphery of the first protection layer and sides of the concave groove of the second protection layer are encapsulated by a laser sintered glass powder process.

15. The display device according to claim 1, wherein the first substrate layer is stacked on the second substrate layer.

* * * * *